United States Patent [19]
Juve et al.

[11] Patent Number: 4,944,015
[45] Date of Patent: Jul. 24, 1990

[54] AUDIO COMPRESSION CIRCUIT FOR TELEVISION AUDIO SIGNALS

[76] Inventors: Ronald A. Juve, 4527 Patton Ave., Boise, Id. 83704; George S. Kaufman, 456 Tenth St., Del Mar, Calif. 92014

[21] Appl. No.: 187,733

[22] Filed: Apr. 29, 1988

[51] Int. Cl.⁵ .......................................... H03G 11/00
[52] U.S. Cl. ...................................... 381/55; 381/59; 381/106
[58] Field of Search .................. 381/55, 59, 96, 106

[56] References Cited

U.S. PATENT DOCUMENTS

| | | |
|---|---|---|
| 2,171,048 | 8/1939 | Rockwell . |
| 3,544,720 | 12/1970 | Corderman et al. .............. 381/55 |
| 3,991,370 | 11/1976 | Pate ..................................... 381/55 |
| 4,064,362 | 12/1977 | Williams . |
| 4,079,211 | 3/1978 | Janssen . |
| 4,224,470 | 9/1980 | Persson . |
| 4,296,278 | 10/1981 | Cullison ........................... 381/55 |
| 4,301,330 | 11/1981 | Trump ............................... 381/55 |
| 4,330,686 | 5/1982 | Roe .................................... 381/55 |
| 4,602,381 | 7/1986 | Cugmini et al. ................. 381/106 |
| 4,661,851 | 4/1987 | Muterspaugh .................. 381/106 |
| 4,701,953 | 10/1987 | White ............................. 381/106 |
| 4,704,726 | 11/1987 | Gibson ........................... 381/106 |
| 4,741,039 | 4/1988 | Bloy ................................ 381/106 |
| 4,864,624 | 9/1989 | Tichy ............................... 381/55 |

FOREIGN PATENT DOCUMENTS

| | | |
|---|---|---|
| 1299328 | 7/1969 | Fed. Rep. of Germany ........ 381/55 |
| 2756159 | 2/1978 | Fed. Rep. of Germany . |
| 2756300 | 6/1978 | Fed. Rep. of Germany . |
| 0142698 | 8/1983 | Japan ............................... 381/55 |

OTHER PUBLICATIONS

Automatic Electric Technical Journal, vol. 3, Apr. 11, 1962, pp. 55–62.

*Primary Examiner*—Forester W. Isen
*Attorney, Agent, or Firm*—Gregg I. Anderson

[57] ABSTRACT

An audio compression circuit for limiting an audio television signal in a linear fashion at a pre-established maximum level is disclosed. The circuit includes a series resistance circuit for establishing a predetermined resistance on an amplifier to establish a supply voltage through a detection and level adjustment circuit. The detection and level adjustment circuit increases the supply voltage to a relatively higher reference voltage, which is shifted through a level adjustment circuit to a control voltage, which control voltage is greater than a threshold voltage of a field effect transistor. The field effect transistor is a significant aspect of a shunt circuit connected in parallel to the detection and level adjustment circuit. The shunt circuit acts in response to the control voltage to vary the resistance across the drain and source of the field effect transistor to prevent the outlet voltage to a loudspeaker from exceeding a predetermined level established by the level adjustment circuit.

29 Claims, 2 Drawing Sheets

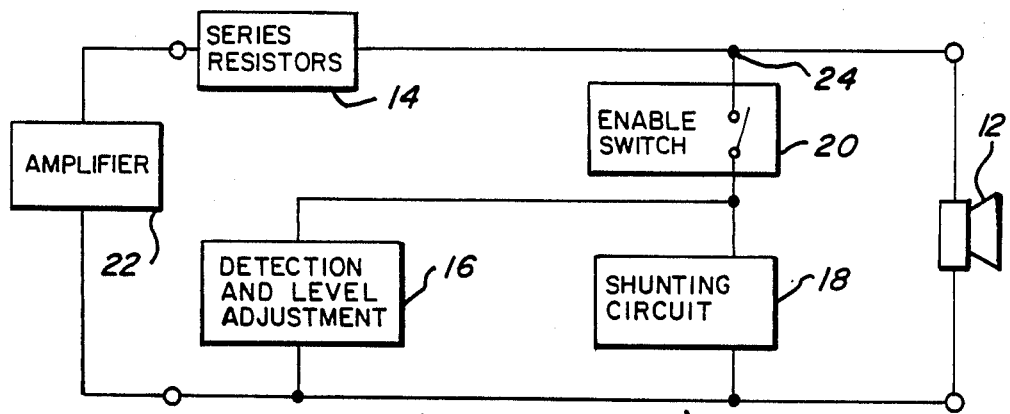
Fig_1
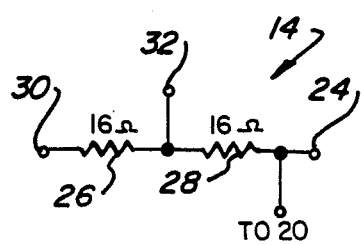
Fig_2
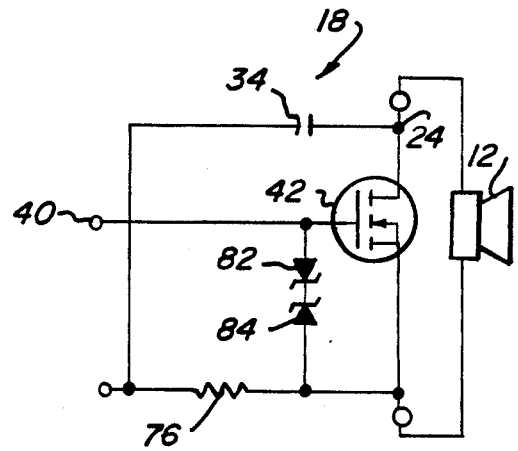
Fig_4
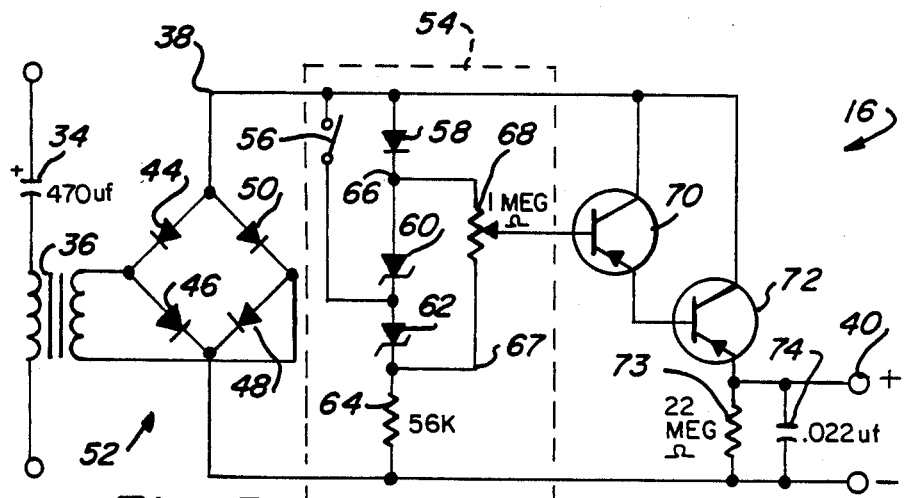
Fig_3

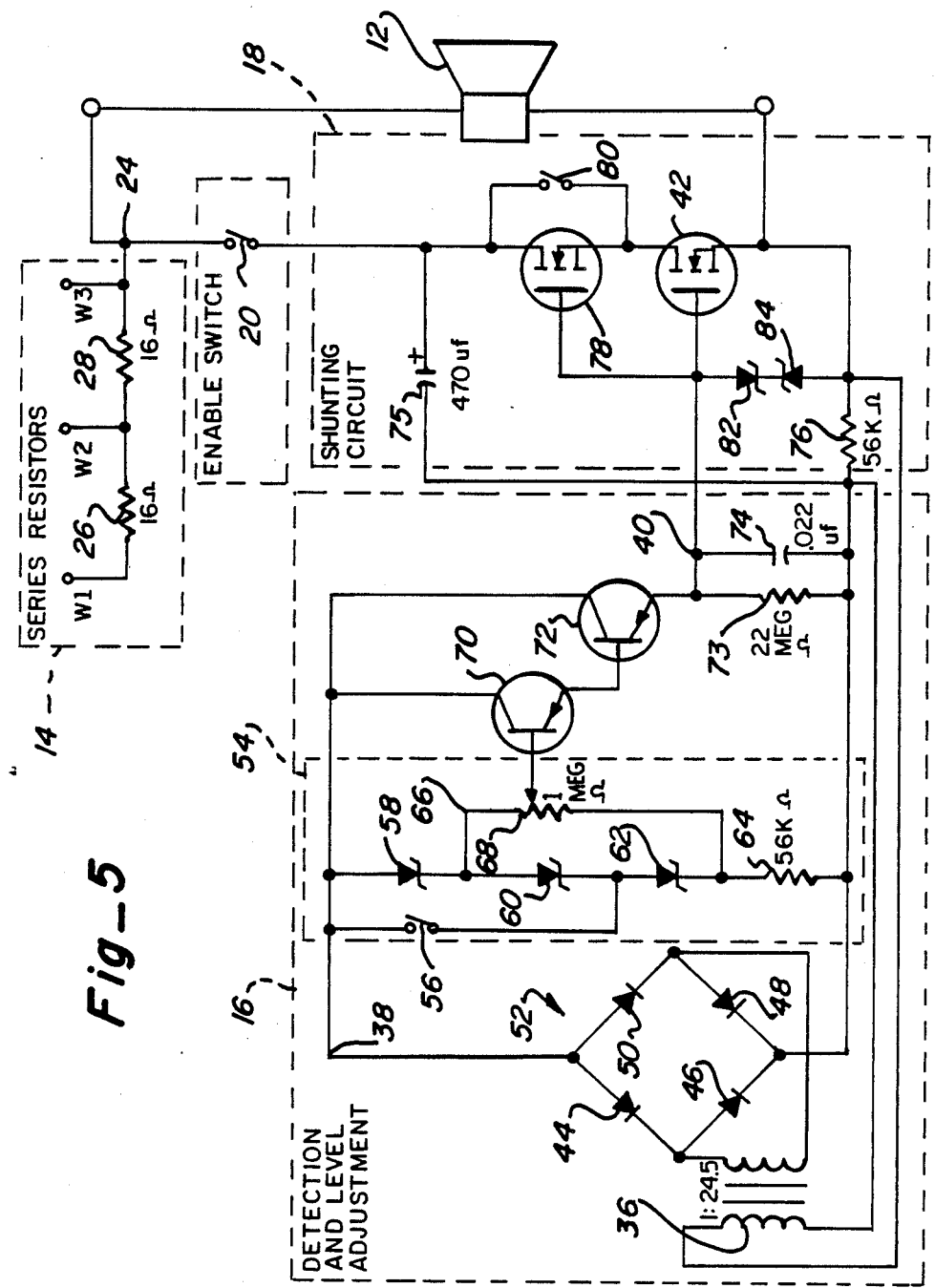
Fig_5

AUDIO COMPRESSION CIRCUIT FOR TELEVISION AUDIO SIGNALS

BACKGROUND OF THE INVENTION

1. Field of the Invention

The invention relates generally to television circuitry. More particularly, the invention relates to signal processing circuitry for the audio portion of a television signal.

2. Description of the Prior Art

Television audio signals have a dynamic range of greater than 20 dB. Excursions to 100% modulation (0 dB) produce higher sound levels, which are annoying to television viewers. Signal conditioning, by equally compressing the audio signal, is sometimes done on the audio portion of the transmitted television signal. The compressed signal is then raised to a higher level of audio modulation at the television receiver, resulting in an increased sound level during portions of a program, such as a commercial.

Prior art patents and other publications show the use of Zener diodes in a sound-limiting circuit for a pair of headphones. In L. Persson (U.S. Pat. No. 4,224,470), the Zener diodes are in a shunt relationship with the earphone speakers to limit voltage, while a field effect transistor (FET) limits current. Voltage limitation is suggested in Persson through a variable resistor connected in series with the earphone speakers.

D. Janssen (U.S. Pat. No. 4,079,211) shows a protective circuit for a telephone receiver. A shunt portion of the circuit includes a junction transistor combined with a Zener diode and a capacitor. A voltage divider is included in the shunt circuit. The circuit also includes a parallel bridge circuit and series variable resistor. The purpose of the Janssen circuit is to protect integrated circuits of a telephone set from undesired signal conditions, such as incorrect polarity and short pulses of high voltage. A control signal turns on a clamping circuit when a given threshold voltage is exceeded.

In a publication, *Automatic Electric Technical Journal*, Vol. 3, April 11, 1962, pp. 55-62, a discussion is made of a device operative on the variations in the voice applied to establish a constant level of output in spite of variations. A transformer is used for impedance matching.

German Pat. No. 2,756,300 shows loudspeaker adjustments for setting the maximum permissible power to the loudspeaker. A series resistor is selected in accordance with the impedance of the amplifier. The maximum power is set by an adjustable or variable resistor. This is a volume adjustment only, no compression of the audio signal at a set level occurs.

Other simple circuits for controlling the signal to an output or speaker, including a series resistor and parallel resistor, are seen in R. Rockwell (U.S. Pat. No. 2,171,048). D. Williams (U.S. Pat. No. 4,064,362) shows a CMOS with a FET employed to automatically limit voltage and the sound produced by a speaker in response to a signal. The Williams patent is directed to earmuffs which would allow only certain audio signal ranges to be received by the human ear.

The prior art tends to clip complex wave forms, thereby changing the quality of sound produced. Some of the prior art limits current only with respect to a single polarity, rather than both positive and negative signals, as is accomplished by the present invention. Rather than clipping the wave form abruptly at a level, the present invention actually reduces the voltage, acting as a resistance, to compress the audio signal.

A separate power supply for the circuit is not required, as is typical in the other prior art described, which have the ability to compress. Those circuits in the prior art which do not utilize power supplies, such as Persson, clip the signal, distorting the audio. If a power supply is used, the circuit is more expensive.

OBJECTS AND SUMMARY OF THE INVENTION

It is the principal object of the present invention to provide a simple audio compression-circuit for television audio signals which compresses audio signal wave forms when the wave form exceeds a predetermined level, establishing a maximum audio sound level.

It is a related object of the present invention to provide an audio compression circuit for television audio signals which minimizes the distortion of the audio signal.

It is a further related object of the present invention to provide an audio compression circuit for television audio signals which acts as a dynamic voltage divider without the need of an independent power supply.

It is another object of the present invention to provide a television audio compression circuit for television audio signals which is easily connected to and matched with the television audio circuit of an existing television receiver.

In accordance with the objects of the invention, an audio compression circuit for television audio signals includes a series resistance circuit for establishing a minimum load impedance on the sound amplifier of a television set. The resistance also establishes a minimum impedance for a shunt circuit or shunting means.

A detection and level adjustment circuit selectively enables the shunt circuit. As the potential across the detection and level adjustment circuit becomes more negative, the voltage to a loudspeaker is clamped by the shunt circuit. Whether clamping occurs is determined by a reference voltage in the detection and level adjustment circuit. A control voltage is established by the value of the reference voltage, which control voltage is used to enable the shunt circuit. If the shunt circuit is enabled, clamping occurs.

The series resistance is connected to the detection and level adjustment circuit by closing a switch. An audio transformer amplifies the input voltage of the audio signal to a level large enough to enable the shunt circuit. As the control voltage becomes more negative, the resistance in the shunt circuit drops dynamically. This reduces the output audio signal and, therefore, the sound level or voltage output of the loudspeaker of the television.

DESCRIPTION OF THE DRAWINGS

FIG. 1 is a block diagram of an audio compression circuit for a television.

FIG. 2 is a circuit diagram of a series resistance circuit of the invention shown in FIG. 1.

FIG. 3 is a circuit diagram of a detection and level adjustment circuit of the invention shown in FIG. 1.

FIG. 4 is a circuit diagram of a shunt circuit of the invention shown in FIG. 1.

FIG. 5 is a circuit diagram of the invention shown in FIG. 1, an alternative embodiment of the shunt circuit being shown.

DESCRIPTION OF THE PREFERRED EMBODIMENT

An audio compression circuit 10 for processing the audio portion of a television signal to a television loudspeaker 12 is seen in FIGS. 1 and 5. The audio compression circuit 10 is used to prevent the audio output of the loudspeaker 12 from exceeding a desired level by clamping the voltage supplied to the loudspeaker 12 according to an adjustable level established by the user. The audio compression circuit 10 controls the maximum output voltage to the loudspeaker 12, minimizing distortion of the audio signal without the need for a power supply.

The audio compression circuit 10 includes a series resistor circuit 14 (FIG. 2), a detection and level adjustment circuit 16 (FIG. 3), and a shunt circuit 18 (FIG. 4). Resistors 26 and 28 of resistor circuit 14 are connected in series between audio amplifier means 22 and the loudspeaker 12. An enable switch 20 is used to manually turn the audio compression circuit 10 on and off. The detection and level adjustment circuit 16 and shunt circuit 18, when the switch 20 is closed, are connected in parallel with the loudspeaker 12 and, as will be seen, are used to control the output voltage supplied to the loudspeaker 12.

The series resistors 26 and 28 of the resistor circuit 14 (FIG. 2) provide the audio amplifier means 22, which produces a source voltage, a minimum load impedance and establish a minimum series resistance at node 24 for the shunt circuit 18. Depending on how the series resistors are connected to the amplifier means 22 and the loudspeaker 12, the series resistance can be changed. In the preferred embodiment, it is desired to match loudspeaker impedance, which typically is 8 ohms, 16 ohms or 32 ohms. Though it is not necessary to perfectly match the impedance of the loudspeaker 12, possible connections of the series resistors 14 are suggested in order to attempt to match the loudspeaker 12 impedance. The first series resistor 26 and a second series resistor 28 each have, in this example, a value of 16 ohms. Connecting first series resistor connection 32 to the amplifier means 22 and first series resistor connection 30 to node 24, which is connected to the loudspeaker, results in a parallel connection between the first series resistor 16 and the second series resistor 28, the equivalent resistance for which is 8 ohms.

Similarly, if the loudspeaker 12 has an impedance of 16 ohms, the amplifier means 22 is connected to the first series resistor connection 32, and the loudspeaker 12 is connected to the node 24, resulting in an equivalent resistance of 16 ohms from the second series resistor 28.

Finally, to get an equivalent resistance of 32 ohms, to match the impedance of a 32 ohm loudspeaker, the first series resistor connection 30 is connected to the amplifier means 22 and the node 24 is connected to the loudspeaker 12, resulting in an equivalent resistance of 32 ohms.

Other loudspeaker impedances could be matched by different series resistor circuits 14 from those shown in the preferred embodiment. Such a match of the series resistor circuits 14 to the impedance of the loudspeaker 12 is recommended to avoid damage to amplifier means 22.

The detection and level adjustment circuit 16 is seen in FIG. 3. In FIG. 5, the detection and level adjustment circuit 16 is shown connected to an alternative embodiment of the shunt circuit 18, the series resistor circuit 14 and the loudspeaker 12.

Closing the switch 20, in the embodiment of FIG. 3, enables the detection and level adjustment circuit 16 by connecting the circuit 16 through a first capacitor 34 to the series resistor circuit 14. The first capacitor 34 couples the audio signal to a transformer 36. For the values typically found in the audio compression circuit 10, a turns ratio of 1:24.5 is chosen to ensure that a supply voltage, established by the amplifier means 22 and the resistor circuit 14 at node 24, is augmented to a larger reference voltage at node 38. As will be seen, the reference voltage is processed by the detection and level adjustment circuit 16 to a predetermined control voltage established at node 40.

The turns ratio on the transformer 36 needs to be sufficient so the control voltage resulting from processing by the detection and level adjustment circuit 16 is large enough to exceed the threshold voltage of a semiconductor triode, which in the preferred embodiment is a semiconductor triode or a MOSFET 42, of the shunt circuit 18. The threshold voltage of the MOSFET 42, typically 3.6 to 3.7 volts, is the gate voltage at which the resistance of the MOSFET changes dramatically toward a minimum "on" resistance. As will be discussed shortly, changing of the control voltage changes the resistance in the MOSFET 42 to limit the maximum output voltage to the loudspeaker 12, clamping the audio wave form to a preselected maximum amplitude.

Diodes 44, 46, 48 and 50 are connected to form a diode bridge 52. The diode bridge 52, in a well-known manner, rectifies the reference voltage established at node 38. The reference voltage is now processed by a voltage shifter 54 of the detection and level adjustment circuit 16, which performs the voltage level adjustment function of the detection and level adjustment circuit 16. Switch 56 is open for higher output voltages usually needed for larger impedance loudspeakers, i.e., 32 ohms. Switch 56 is closed for lower output voltages usually needed for lower impedance, i.e., 8 ohm loudspeakers. With switch 56 open, the voltage shifter 54 includes three Zener diodes 58, 60 and 62, connected in series with resistor 64. The resistor 64 is sufficiently large to limit the current passing through the Zener diodes 58, 60 and 62. In the preferred embodiment, the diodes 58, 60 and 62 are reversed biased base emitter junctions of 2N3906 transistors having an avalanche breakdown voltage of 6.5 volts at 10 microamperes. Avalanche breakdowns of the transistors have a sharper transition to conduction than Zener breakdowns at low currents, providing a predictable voltage shift. It is important to draw as little current as possible from the transformer 36, since the input current to the transformer from node 24 is increased by the transformer proportional to the turns ratio. This increases the current through the series resistant circuit 14, which can affect the signal level to the loudspeaker 12.

As the reference voltage at 38 becomes more negative, diode 58 reaches its breakdown voltage. The voltage at node 66, at the connection between the diode 60 and a potentiometer or variable resistor 68, becomes negative. The voltage across the base emitter junctions of transistors 70 and 72 increases as the reference voltage becomes more negative. The transistors 70 and 72 are emitter followers to buffer the high resistance of the variable resistor 68 and supply current to charge capacitor 74. It is desired that capacitor 74 change quickly to enable the shunt circuit 18 to respond to rapid changes, particularly increases, in audio signal level. If variable resistor 68 were connected directly to capacitor 74, the response of the circuit would be a function of the wiper position of variable resistor 68. Transistors 70 and 72 provide both a low impedance to change capacitor 74 quickly and a high impedance to resistor 68 to minimize the current through resistor 68 which would change the voltage at node 40. Functionally, the reference voltage at 38 is shifted by the voltage shifter 54 to the capacitor 74 to establish the control voltage at node 40.

Moving the wiper of the resistor 68 toward node 67, increases the potential voltage shifted from the reference voltage to the control voltage. The signal level to the loudspeaker 12 increases as the reference voltage is required to be more negative to charge the capacitor 74, establishing an effective control voltage at node 40. When a minimum resistance is applied to the variable resistor 68, the voltage is enough to forward bias the diode bridge 52, the three Zener diodes 58, 60 and 62, and the transistors 70 and 72, and still charge the capacitor 74 to an effective control voltage. Assuming the diodes in the diode bridge 52 at a 0.5 volt forward voltage, the Zener diodes 58, 60 and 62 at 6.5 volts each, the base emitter voltages of the transistors 70 and 72 at 0.5 volt., and assuming a control voltage of 4 volts, with the turns ratio of 24.5 to 1, the output voltage to the loudspeaker 12 would be 1 volt peak.

Enablement of the minimum signal through variation of the resistance in resistor 68, by moving the wiper away from node 67, would incorporate voltages from one Zener diode, resulting in a peak voltage of 0.5 volt.

When the switch 56 is closed, a lower range is selected. Only the Zener diode 62 is in the circuit. If the wiper of the variable resistor 68 is at node 66, then all of the voltage is applied to the transistors 70 and 72 and the capacitor 74. The compression of the signal is at a maximum, and the signal is around 0.24 volt to the loudspeaker 12.

Moving the wiper of resistor 68 to the node 67, the voltage output to the loudspeaker 12 increases, due to the effect of the diode 62 being in the circuit, and the peak voltage becomes approximately 0.5 volt.

Many arrangements of couplings of the output of the transformer 36 are possible. The preferred embodiment allows for a smooth 6 dB change in audio signal level by moving the wiper of the potentiometer 68 in either the low range or high range, with the high range being a continuation of the low range.

The shunt circuit 18 (FIG. 4) is connected to the detection and level adjustment circuit 16 to apply the control voltage to the MOSFET 42. The control voltage is applied to the gate of the MOSFET 42. The resistance between the drain and source of the MOSFET 42 changes in accordance to the control voltage at the node 40. As the control voltage becomes more negative, the resistance between the drain and the source of the MOSFET 42 is reduced, reducing the output voltage to the loudspeaker 12. The shunt circuit 18 and the series resistor circuit 14 can be thought of as a resistance divider. The output of the amplifier means 22 is divided by the series resistor circuit 14 and the resistance between the drain and the source of the MOSFET 42 of the shunt circuit 18.

When the source voltage supplied by the amplifier means 22 is small, the resistance between the drain and the source of the MOSFET 42 is large. As the voltage from the amplifier 22 increases, the reference voltage and the control voltage also increase. When the resistance between the drain and source of the MOSFET 42 decreases, the transfer function value or ratio of the output voltage at the loudspeaker 12 to the source voltage from the amplifier 22, is decreased. The decreased transfer function creates the desired signal compression by allowing less of the source voltage to reach the loudspeaker 12. The control voltage is stored on capacitor 74. Without capacitor 74, the control voltage 40 would change with the output voltage causing the peaks of the signal to be clipped. With capacitor 74, the control voltage is stored at the gate of the MOSFET 42, maintaining the ratio between the output voltage and source voltage for a time determined by the time constant of resistor 73 in parallel with capacitor 74. Sounds very often are initially a higher level and then decrease in amplitude. If the voltage were stored in capacitor 74 for many seconds without decaying, the quiet passages might be quieter than necessary. The decay of the voltage on capacitor 74 allows better "tracking" of the audio level; quiet passages are not compressed and potentially loud passages are compressed.

A capacitor 75 and resistor 76 improve the linearity of the shunt circuit 18 by applying a signal proportional to the drain voltage at node 24 to the gate of the MOSFET 42. This reduces the distortion when positive drain voltages exist and is effective up to 0.5 volt. Signals larger than 0.5 volt can be distorted when the single MOSFET 42 is used. Adding an additional semiconductor triode or MOSFET 78, in the alternative embodiment shown in (FIG. 5), operative on switch 80, improves the linearity of the compression circuit 10 up to 1.0 volt.

The potential at the node between the capacitor 75 and the resistor 76 is the same as the potential between capacitor 34 and the transformer 36 over the frequencies of interest. The transformer 36 can be connected across the resistor 76 and capacitor 34 eliminated, as is shown in FIG. 5. Diodes 82 and 84 protect the gate of the MOSFET 42. The MOSFET 42, ideally an IRFD9110, is limited to plus or minus 20 volts between the gate and the source. The Zener diodes 82 and 84 limit the voltage to less than an absolute value of 20 volts without affecting the control voltage, which is typically 4 to 6 volts. The MOSFET 42 as specified is a p-channel device with an integral drain to source diode. The diode clamps at a drain to source voltage much higher than most MOSFETS. In the audio compression circuit 10, it would not affect positive voltages up to 1.5 volts. This is beyond the designed maximum level of 1.0 volt. The equivalent "on" resistance n-channel device can clamp at 0.7 volt or lower.

The audio compression circuit 10 forms a shunt regulator circuit. If the signal detected at the drain of the MOSFET 42 increases, the control voltage from the detection circuit 16 becomes more negative. As the control voltage on the gate of the MOSFET 42 becomes more negative, the resistance between the drain and the source lessens, reducing the output voltage to the loudspeaker 12. This results in compression of the audio signal to the loudspeaker 12 of the television without the need for an external power source.

Although the present invention has been described with a certain degree of particularity, it is understood the present disclosure has been made by way of example, and changes in detail or structure may be made without departing from the spirit of the invention, as defined in the appended claims.

We claim:

1. An audio compression circuit for processing an audio signal comprising in combination:
   amplifier means for supplying the audio signal at a source voltage;
   resistance means connected in series to said amplifier means for providing a minimum resistance to said amplifier means and creating a voltage drop of said source voltage to establish a supply voltage;
   detection means connected to said resistance means for increasing the supply voltage to a reference voltage;
   level adjustment means connected to said detection means for processing the reference voltage into a continuously variable control voltage;
   shunting means connected to said level adjustment means and said resistance means, said shunting means operative by said control voltage for changing the resistance of said shunting means in a continuous manner in response to said control voltage to establish a maximum output voltage; and
   loudspeaker means connected in parallel to said amplifier means for receiving an output voltage from the circuit and producing an audio sound.

2. The invention as defined in claim 1 wherein said resistance means is connected in series between said amplifier means and said detection means, level adjustment means and shunting means.

3. The invention as defined in claim 1 wherein a resistance of said resistance means substantially matches an impedance of said loudspeaker means.

4. The invention as defined in claim 1 where said detection means increases the supply voltage approximately 24.5 times to establish the reference voltage.

5. The invention as defined in claim 1 wherein the level adjustment means includes a high range and a low range.

6. The invention as defined in claim 1 wherein said level adjustment means is selectively set between a minimum and maximum value, the value establishing said control voltage proportional to said reference voltage.

7. An audio compression circuit for processing an output audio signal of an amplifier which is connected to a loudspeaker comprising in combination:
   detection means for sensing a voltage of said output signal and for generating a control voltage; and
   shunting means operative by said control voltage, said shunting means having a continuously variable responsive to said control voltage, which said resistance establishes an output voltage to said loudspeaker, whereby the dynamic range of the audio signal is limited to reduce peak volume fluctuations.

8. The invention as defined in claim 7 wherein said audio compression circuit further includes:
   resistance means connected to said amplifier whereby said resistance means and said shunting means define a voltage divider circuit for the source voltage of said amplifier.

9. The invention as defined in claim 8 wherein said resistance means substantially matches an impedance of said loudspeaker.

10. The invention as defined in claim 9 wherein said level adjustment means includes a high range and a low range.

11. The invention as defined in claim 7 wherein said detection means further includes level adjustment means for setting a reference voltage, which control voltage is proportional to the reference voltage.

12. The invention as defined in claim 7 wherein said shunting means further includes a semiconductor triode connected in parallel to said detection means and operative on the control voltage to establish the output voltage to the loudspeaker.

13. The invention as defined in claim 12 wherein said shunting means further includes a second semiconductor triode selectively incorporated with said first semiconductor triode for improvement of the linearity of the audio compression circuit for relatively larger output voltages.

14. The invention as defined in claim 7 wherein the control voltage is stored in a resistor capacitor circuit to allow better tracking of the audio signal as the control voltage changes.

15. An audio compression circuit for processing an audio signal received by a television receiver, comprising in combination:
   means in shunt with a loudspeaker for compressing the audio signal provided to the loudspeaker by compressing the audio wave form amplitude in a continuous manner, and maintaining the shape of the wave form without discontinuity, whereby the dynamic range of the audio signal is limited to reduce peak volume fluctuations.

16. The invention as defined in claim 15 wherein said means for compressing the audio wave form further include:
   detection means for sensing an amplifier's source voltage, said compression means further including resistance means connected in series to said amplifier, and said detection means further for processing said source voltage into a control voltage; and
   shunting means operative on said control voltage for establishing an output voltage to a loudspeaker of the television receiver.

17. The invention as defined in claim 16 wherein said resistance means and shunting means defining a voltage divider circuit.

18. The invention as defined in claim 16 wherein said shunting means includes means for storing said control voltage and releasing said voltage over time in response to the audio signal.

19. The invention as defined in claim 16 wherein said shunting means establishes an output voltage through a semiconductor triode connected in parallel to said detection means.

20. The invention as defined in claim 19 wherein an additional semiconductor triode is selectively incorporated with said first semiconductor triode for larger output voltages.

21. An audio compression circuit for processing an audio signal comprising, in combination:
   amplifier means for supplying the audio signal at a source voltage;
   resistance means connected in series to said amplifier means for providing a minimum resistance to said amplifier means and creating a voltage drop of said source voltage to establish a supply voltage;
   detection means for increasing the supply voltage approximately 24.5 times to establish a reference voltage, said detection means connected in parallel to said amplifier means;
   level adjustment means incorporated in said detection means for processing the reference voltage into a control voltage;

shunting means connected in parallel to said detection means and said level adjustment means operative by said control voltage for changing the resistance of said shunting means in response to said control voltage to establish a maximum output voltage; and loudspeaker means connected in parallel to said amplifier means for receiving an output voltage from the circuit and producing an audio sound.

22. An audio compression circuit for processing an audio signal of an amplifier received as an input to a loudspeaker for producing an audio sound, comprising in combination:

detection means for sensing a source voltage of said amplifier and for creating a continuously variable control voltage;

shunting means operative by said control voltage, said shunting means having resistance means connected to said amplifier responsive to said control voltage, which said resistance means and shunting means define a resistance divider circuit for said source voltage to establish a continuously variable output voltage to said loudspeaker.

23. The invention as defined in claim 22 wherein said resistance means substantially matches an impedance of said loudspeaker.

24. The invention as defined in claim 22 wherein said shunting means further includes first and second semiconductor triodes, said first semiconductor triode connected in parallel to said detection means and operative on the control voltage to establish the output voltage to the loudspeaker and said second semiconductor triode selectively incorporated with said first semiconductor triode for improvement of the linearity of the audio compression circuit for relatively larger output voltages.

25. The invention as defined in claim 22 wherein the control voltage is stored in a resistor capacitor circuit to allow better tracking of the audio signal as the control voltage changes.

26. An audio compression circuit for processing an audio signal received by a television receiver, comprising in combination:

amplifier means for supplying the audio signal to a loudspeaker of said television receiver;

means for compressing the audio signal provided to the loudspeaker by compressing the audio wave form amplitude in a continuously variable and maintaining the shape of the wave form without discontinuity;

detection means for sensing a source voltage at the amplifier means, and processing said source voltage into a control voltage;

shunting means operative on said control voltage for establishing an output voltage to the loudspeaker; and resistance means connected in series to said amplifier means, said resistance means and said shunting means defining a voltage divider circuit.

27. The invention as defined in claim 26, wherein said shunting means further includes:

means for storing said control voltage and releasing said control voltage over time in response to the audio signal.

28. The invention as defined in claim 26 wherein said shunting means further establishes said output voltage through a semiconductor triode and an additional semiconductor triode is connected to the first semiconductor triode for large output voltages.

29. An audio compression circuit for processing an audio signal received by a television receiver, comprising in combination:

means responsive to a voltage of the audio signal for generating a control signal; and means providing the audio signal to a loudspeaker and responsive to the control signal for compressing the audio signal provided to the loudspeaker by compressing the audio wave form amplitude in a continuous manner, maintaining the shape of the wave form without discontinuity, whereby the dynamic range of the audio signal is limited to reduce peak volume fluctuations.

* * * * *